(12) United States Patent
Masuya (10) Patent No.: US 8,097,892 B2
(45) Date of Patent: Jan. 17, 2012

(54) LIGHT-EMITTING DIODE (75) Inventor: Kyousuke Masuya, Chichibu (JP)

(73) Assignee: Showa Denko K.K., Tokyo (JP)

( * ) Notice: Subject to any disclaimer, the term of this patent is extended or adjusted under 35 U.S.C. 154(b) by 217 days.

(21) Appl. No.: 12/278,648

(22) PCT Filed: Feb. 9, 2007

(86) PCT No.: PCT/JP2007/052896
§ 371 (c)(1),
(2), (4) Date: Oct. 7, 2008

(87) PCT Pub. No.: WO2007/094476
PCT Pub. Date: Aug. 23, 2007

(65) Prior Publication Data
US 2009/0127578 A1    May 21, 2009

Related U.S. Application Data (60) Provisional application No. 60/775,359, filed on Feb. 22, 2006.

(30) Foreign Application Priority Data

Feb. 14, 2006 (JP) ................. 2006-036169

(51) Int. Cl.
*H01L 29/18* (2006.01)
*H01L 33/00* (2010.01)
(52) U.S. Cl. ............... 257/98; 257/88; 257/E33.067
(58) Field of Classification Search ........... 257/88, 257/98, E33.067
See application file for complete search history.

(56) References Cited

U.S. PATENT DOCUMENTS

| 5,610,413 | A | 3/1997 | Fan et al. |
| 6,064,076 | A | 5/2000 | Chen et al. |
| 6,740,906 | B2 | 5/2004 | Slater, Jr. et al. |
| 7,026,652 | B2 * | 4/2006 | Konno et al. ............ 257/79 |

(Continued)

FOREIGN PATENT DOCUMENTS

JP    58-34985 A    3/1983

(Continued)

OTHER PUBLICATIONS

Y. Hosokawa, et al.; "High-power ohmic-electrodes dispersive AlGaInP double-hetero structure yellowish-green light-emitting diodes"; Journal of Crystal Growth 221 (2000); pp. 652-656.

(Continued)

*Primary Examiner* — Kiesha Bryant
*Assistant Examiner* — Jeremy Joy
(74) *Attorney, Agent, or Firm* — Sughrue Mion, PLLC (57) ABSTRACT A light-emitting diode (10) has a main light-extracting surface and includes a compound semiconductor layer (13) including semiconductor layers (130 to 135), a light-emitting part (12) contained in the compound semiconductor layer, a light-emitting layer (133) contained in the light-emitting part, a transparent substrate (14) joined to the compound semiconductor layer, and first and second electrodes (15, 16) of opposite polarities formed on the main light-extracting surface on the side opposite the transparent substrate. The second electrode is formed at a position on the portion of the compound semiconductor layer exposed by removing the semiconductor layers (132 to 134) and has the periphery thereof enclosed with the semiconductor layers. The main light-extracting surface has an external shape having the largest width of 0.8 mm or more.

19 Claims, 10 Drawing Sheets

U.S. PATENT DOCUMENTS

| | | | |
|---|---|---|---|
| 7,045,375 B1 * | 5/2006 | Wu et al. | 438/35 |
| 7,250,637 B2 * | 7/2007 | Shimizu et al. | 257/98 |
| 2002/0093023 A1 * | 7/2002 | Camras et al. | 257/94 |
| 2004/0031967 A1 * | 2/2004 | Fudeta et al. | 257/79 |
| 2004/0061123 A1 * | 4/2004 | Shelton et al. | 257/99 |
| 2005/0067625 A1 * | 3/2005 | Hata | 257/81 |
| 2005/0093015 A1 * | 5/2005 | Kurahashi et al. | 257/103 |
| 2005/0253161 A1 * | 11/2005 | Horio et al. | 257/100 |
| 2006/0043392 A1 * | 3/2006 | Kurahashi et al. | 257/91 |
| 2006/0160257 A1 * | 7/2006 | Wu et al. | 438/22 |
| 2007/0224714 A1 * | 9/2007 | Ikeda et al. | 438/26 |

FOREIGN PATENT DOCUMENTS

| | | |
|---|---|---|
| JP | 6-302857 A | 10/1994 |
| JP | 2588849 B2 | 12/1996 |
| JP | 2001-57441 A | 2/2001 |
| JP | 3230638 B2 | 9/2001 |
| JP | 2002246640 A | 8/2002 |
| JP | 2003-249682 A | 9/2003 |
| JP | 2003-309286 A | 10/2003 |
| JP | 2004-128321 A | 4/2004 |
| JP | 2004-521494 A | 7/2004 |
| JP | 2005-142602 A | 6/2005 |
| JP | 2005142602 A * | 6/2005 |
| JP | 2005-328080 A | 11/2005 |
| WO | 02/061847 A2 | 8/2002 |

OTHER PUBLICATIONS

Y. Hosokawa, et al.; "High-power ohmic-electrodes dispersive AlGaInP double-hetero structure yellowish-green light-emitting diodes"; Journal of Crystal Growth 221 (2000); pp. 652-656.

* cited by examiner

XVII— —XVII

LIGHT-EMITTING DIODE

CROSS REFERENCE TO RELATED APPLICATIONS

This application is an application filed under 35 U.S.C. §111(a) claiming the benefit pursuant to 35 U.S.C. §119(e)(1) of the filing dates of Provisional Application No. 60/775,359 filed Feb. 22, 2006 and Japanese Patent Application No. 2006-036169 filed Feb. 14, 2006 pursuant to 35 U.S.C. §111(b).

TECHNICAL FIELD

This invention relates to a light-emitting diode and particularly to a transparent-substrate, junction-type, large-sized light-emitting diode having high brightness.

BACKGROUND ART

As a Light-Emitting Diode (LED) capable of issuing a visible light in red color, orange color, yellow color or yellowish green color, the compound semiconductor LED that is provided with a light-emitting layer formed of aluminum-gallium-indium phosphide $((Al_XGa_{1-X})_YIn_{1-Y}P$ in which $0 \leq X \leq 1$ and $0 \leq Y \leq 1)$. has been hitherto known. In the LED of this kind, the light-emitting part provided with a light-emitting layer formed of $(Al_XGa_{1-X})_YIn_{1-Y}P$ in which $0 \leq X \leq 1$ and $0 \leq Y \leq 1$ is generally formed on a substrate material, such as gallium arsenide (GaAs), which is optically impervious to the light emitted from the light-emitting layer and mechanically not too strong.

Recently, therefore, with a view to obtaining a visible LED of higher brightness and with the object of further enhancing the mechanical strength of the device, the technique for configuring a junction-type LED by expelling a substrate material impervious to the emitted light and thereafter incorporating anew a supporting layer (transparent substrate) capable of transmitting the emitted light and as well excellent in mechanical strength more than ever has been being developed (refer, for example, to Japanese Patent No. 3230638, JP-A HEI 6-302857, JP-A 2002-246640, Japanese Patent 2588849 and JP-A 2001-57441).

For the purpose of obtaining a visible LED of high brightness, the method for enhancing the efficiency of light extraction by utilizing the shape of a device has been being used. In the configuration of a device having electrodes formed respectively on the first surface and the back surface of a semiconductor light-emitting diode, the technique for effecting impartation of high brightness by utilizing the shapes of side faces has been disclosed (refer, for example, to JP-A SHO 58-34985 and U.S. Pat. No. 6,229,160).

Though the junction-type LED has made it possible to provide an LED of high brightness, the need to seek an LED of yet higher brightness is still persisting. Numerous shapes have been proposed for the devices that are so configured as to have electrodes formed respectively on the first surface and the back surface of a light-emitting diode. The device of a configuration having two electrodes formed on a light-extracting surface is complicated in shape and has not been optimized as respects the state of side faces and the disposition of electrodes.

This invention has been produced for the purpose of solving the problem mentioned above and is directed toward the light-emitting diode provided on the light-extracting surface thereof with two electrodes and is aimed at providing a light-emitting diode of high brightness that exhibits a high efficiency in the extraction of light.

DISCLOSURE OF THE INVENTION

The present invention provides as the first aspect thereof a light-emitting diode having a main light-extracting surface and comprising: a compound semiconductor layer including semiconductor layers, a light-emitting part contained in the compound semiconductor layer, a light-emitting layer contained in the light-emitting part, a transparent substrate joined to the compound semiconductor layer, and first and second electrodes of opposite polarities formed on the main light-extracting surface on a side opposite the transparent substrate, wherein the second electrode is formed at a position on a portion of the compound semiconductor layer exposed by removal of the semiconductor layers and has a periphery enclosed with the semiconductor layers and wherein the main light-extracting surface has an external shape having a largest width of 0.8 mm or more.

The second aspect of the present invention is directed to the light-emitting diode of the first aspect, wherein the transparent substrate is a substrate that is pervious to light emitted from the light-emitting part.

The third aspect of the invention is directed to the light-emitting diode of the first or second aspect, wherein the transparent substrate contains a first side face nearly perpendicular and falling on a side of the light-emitting part and a second side face continuing to the first side face and having an inclined surface formed on a side distant from the light-emitting layer.

The fourth aspect of the invention is directed to the light-emitting diode of the third aspect, wherein the inclined surface of the second side face has an angle of inclination that is 10° or more and less than 20° and wherein the light-emitting part, when seen as projected on a light-emitting surface, has part thereof formed above the second side face.

The fifth aspect of the invention is directed to the light-emitting diode of any one of the first to fourth aspects, wherein the transparent substrate has a bottom surface formed thereon with irregularities having differences of elevation in a range of 0.1 µm to 10 µm.

The sixth aspect of the invention is directed to the light-emitting diode of any one of the first to fifth aspects, wherein the transparent substrate is formed of GaP.

The seventh aspect of the invention is directed to the light-emitting diode of the sixth aspect, wherein the transparent substrate is formed of n-type GaP and has a roughly (111) face as its main surface.

The eighth aspect of the invention is directed to the light-emitting diode of any one of the first to seventh aspects, wherein the transparent substrate has a thickness in a range of 50 to 300 µm.

The ninth aspect of the invention is directed to the light-emitting diode of any one of the first to the eighth aspects, wherein the light-emitting layer, first electrode and second electrode have areas $S_A$, $S_1$ and $S_2$, respectively, that satisfy relations of $80\% < S_A < 90\%$, $10\% < S_1 < 20\%$ and $5\% < S_2 < 10\%$, on condition that the light-emitting diode has a light-emitting surface of an external shape having an area of 100%.

The tenth aspect of the invention is directed to the light-emitting diode of one of the first to ninth aspects, wherein the second electrode is composed of two or more straight lines of an equal length extending mutually in parallel and having extreme points on opposite sides thereof wherein an imaginary line connecting the extreme points on each side lies nearly in parallel to a side face of the light-emitting diode, and one or more lines connecting the extreme points on nearer sides of two adjacent parallel straight lines at an arbitrarily selected one of the opposite sides of the parallel straight lines.

The eleventh aspect of the invention is directed to the light-emitting diode of any one of the third to tenth aspects, wherein the second electrode is apt to fall outside a range of the inclined surface of the second face when it is projected on a light-emitting surface.

The twelfth aspect of the invention is directed to the light-emitting diode of one of the first to the eleventh aspects, wherein a distance E μm between an end of the second electrode and an end of the light-emitting part and a main light-emitting wavelength $\lambda_D$ nm satisfy relations of $570<\lambda_D<635$ and $0.8\times\lambda_D-350<E<1.6\times\lambda_D-750$.

The thirteenth aspect of the invention is directed to the light-emitting diode of one of the first to the twelfth aspects, wherein when the first electrode is formed by combining lines having a width of 15 μm or less, a distance D μm between the adjacent lines and a main light-emitting wavelength $\lambda_D$ nm satisfy relations of $570<\lambda_D<635$ and $0.4\times\lambda_D-200<D<0.8\times\lambda_D-400$.

The fourteenth aspect of the invention is directed to the light-emitting diode of one of the first to the thirteenths aspects, further comprising a transparent electrically conductive film formed so as to cover the first electrode and at least part of the light-extracting surface.

The fifteenth aspect of the invention is directed to the light-emitting diode of the fourteenth aspect, wherein the transparent electrically conductive film is formed of ITO.

The sixteenth aspect of the invention is directed to the light-emitting diode of one of the first to the fifteenth aspects, wherein the light-emitting part contains a GaP layer and the second electrode is formed on the GaP layer.

The seventeenth aspect of the invention is directed to the light-emitting diode of one of the first to the sixteenth aspects, wherein the first electrode is in an n-type polarity and the second electrode is in a p-type polarity.

The eighteenth aspect of the invention is directed to the light-emitting diode of one of the first to the seventeenth aspects, wherein the compound semiconductor layer containing the light-emitting part is formed of a composition of $(Al_XGa_{1-X})_YIn_{1-Y}P$ ($0\leq X\leq 1$, $0<Y\leq 1$).

The nineteenth aspect of the invention is directed to the light-emitting diode of one of the first to the eighteenth aspects, wherein the light-emitting part contains AlGaInP.

The twentieth aspect of the invention is directed to the light-emitting diode of one of the third to the nineteenth aspects, wherein the first side face and the second side face are formed by the dicing method.

According to this invention, it is made possible to heighten the efficiency of light extraction from the light-emitting part of an LED and consequently accomplish provision of a light-emitting diode exhibiting high brightness.

The above and other objects, characteristic features and advantages of the present invention will become apparent to those skilled in the art from the description to be given herein below with reference to the accompanying drawings.

BEST MODE FOR CARRYING OUT THE INVENTION

The light-emitting part contemplated by this invention is a compound semiconductor stacked structure containing a light-emitting layer and possessing a p-n junction. The light-emitting layer may be constructed with a compound semiconductor of either of the conductive types, i.e. n-type and p-type. This compound semiconductor is preferably represented by the general formula $(Al_XGa_{1-X})_YIn_{1-Y}P$ ($0\leq X\leq 1$, $0<Y\leq 1$). Though the light-emitting part may be in any of the structures of double hetero, Single Quantum Well (SQW) and Multi-Quantum Well (NQW), it is proper to select the MQW structure for the sake of obtaining light emission excelling in monochromaticity. The barrier layer that constitutes the Quantum Well (QW) and the composition of $(Al_XGa_{1-X})_YIn_{1-Y}P$ ($0\leq X\leq 1$, $0<Y\leq 1$). that forms the well layer are so decided that a quantum level inducing light emission of an expected wavelength may be formed in the well layer.

The light-emitting part comprises the light-emitting layer and, with the object of enabling the carrier capable of inducing radiation recombination and the emitted light to be "entrapped" in the light-emitting layer, and clad layers disposed respectively on the opposite sides of the light-emitting layer as opposed to each other to form the so-called Double Hetero (DH) structure. This is most advantageous for securing the light emission of high intensity. The clad layers prefer to be formed of a semiconductor material possessing a wider forbidden band than the compound semiconductor forming the light-emitting layer and exhibiting a high refractive index. Regarding the light-emitting layer formed of a composition of $(Al_{0.4}Ga_{0.6})_{0.5}In_{0.5}P$, capable of emitting yellowish green light of a wavelength of about 570 nm, for example, the clad layers are formed of a composition of $(Al_{0.7}Ga_{0.3})_{0.5}In_{0.5}P$ (Y. Hosokawa et al., J. Crystal Growth, 221 (2000), 652-656). Between the light-emitting layer and each of the clad layers, an intermediate layer adapted to vary moderately the band discontinuity between the two layers may be interposed. In this case, the intermediate layer prefers to be formed of a semiconductor material possessing a forbidden band width intermediate between the light-emitting layer and the clad layers.

This invention, for the purpose of enhancing brightness, heat-radiating property and mechanical strength, contemplates producing a structure excelling in characteristic properties by joining a transparent substrate to a light-emitting part containing a light-emitting layer grown on a semiconductor substrate. The transparent substrate may be formed, for example, of a Group III-V compound semiconductor crystal, such as gallium phosphide (GaP) or aluminum-gallium arsenide (AlGaAs), a Group II-VI compound semiconductor crystal, such as zinc sulfide (ZnS) or zinc selenide (ZnSe), or a Group IV semiconductor crystal, such as hexagonal or cubic silicon carbide (SiC).

The transparent substrate prefers to have a thickness of about 50 μm or more in order that it may be able to support the light-emitting part with mechanically sufficient strength. It also prefers to have a thickness not exceeding about 300 μm in order that it may succumb to mechanical processing easily subsequent to being joined. In the compound semiconductor LED that is provided with a light-emitting layer formed of $(Al_XGa_{1-X})_YIn_{1-Y}P$ ($0 \leq X \leq 1$, $0 < Y \leq 1$), for example, it is most suitable to have the transparent substrate formed of an n-type GaP single crystal having a thickness of about 50 μm or more and about 300 μm or less.

Particularly when the transparent substrate selects gallium phosphide (GaP) as a material convenient for the transmission to the exterior of the light emitted from the light-emitting layer formed of $(Al_XGa_{1-X})_YIn_{1-Y}P$ ($0 \leq X \leq 1$, $0 < Y \leq 1$), the junction to the GaP surface having the same quality of material is at an advantage in obtaining good conditions of junction, such as high mechanical strength and agreement of thermal expansion coefficients.

This invention manifests a great effect when the external shape of the main light-extracting surface has the largest width of 0.8 mm or more. The term "largest width" refers to the longest part of the external shape of the surface. In the case of a rectangle or a square, for example, the diagonal line constitutes the largest width. The adoption of this structure is a necessary thing for the light-emitting diode that fits high-current usage needed in recent years. When the size is enlarged, the special device configuration, from the design of electrodes down, proves to be important for enabling uniform flow of the electric current.

This invention further requires the second electrode to be formed at such a position that the periphery thereof may be enclosed with the semiconductor layer. By adopting this structure, it is made possible to make uniform the distance of the second electrode from the semiconductor layer, allow uniform flow of the electric current and minimize the area of the second electrode without having to add to the resistance. Since the second electrode is formed in the region remaining after removal of the light-emitting layer, the minimization of the area induces an effect of imparting high brightness.

Particularly this invention prefers to have a structure wherein the light-emitting part contains a GaP layer and the second electrode is formed on the GaP layer. By adopting this structure and owing to the fact that GaP is a transparent material as well, it is made possible to form an ohmic electrode manifesting low contact resistance to metal and induce an effect in cutting resistance.

The transparent substrate about to be joined prefers to be a substrate allowing mass production and exhibiting stable quality and specifically prefers to consist of inexpensively procurable GaP single crystal. The substrate prefers to have a (100) face or a (111) face. It is particularly favorable to use an n-type GaP single crystal having a nearly (111) face as the main surface. The n-type substrate has a high transmission factor as compared with the p-type substrate for the same impurity concentration and, therefore, proves to be favorable for the sake of impartation of high brightness. This is because the (111) face possesses a characteristic property of allowing easy formation of irregularities.

The light-emitting part can be formed on the surface of the Group III-V compound semiconductor single crystal substrate, such as gallium arsenide (GaAs), indium phosphide (InP), or gallium phosphide (GaP) or the silicon (Si) substrate. The light-emitting part is favorably formed in the Double Hetero (DH) structure that is capable of "entrapping" the emitted light in conjunction with the carrier responsible for radiation recombination. Then, the light-emitting layer is favorably formed in the SQW structure or the Multi-Quantum Well (MQW) structure for the purpose of obtaining light emission excelling in monochromaticity. As examples of the means to form the component layers of the light-emitting part, the MetalOrganic Chemical Vapor Deposition (MOCVD) means, the molecular beam epitaxial (MBE) means and the Liquid Phase Epitaxial (LPE) means may be cited.

Between the substrate and the light-emitting part, a buffer layer fulfilling such a function as alleviating the lattice mismatch between the material of the substrate and the component layers of the light-emitting part, a Bragg reflection layer serving to reflect the light emitted from the light-emitting layer to the exterior of the device, an etching stop layer utilized for selective etching and the like are interposed. Then, on the component layers of the light-emitting part, a contact layer for lowering the contact resistance of the ohmic electrode, an electric current diffusion layer for diffusing the device-operating electric current throughout the entire plane of the light-emitting part, an electric current inhibition layer for restricting the region passing the device-operating electric current, an electric current constriction layer, and the like may be installed.

This invention is characterized by having a first electrode and a second electrode different in polarity from the first electrode formed on the main light-extracting surface of the light-emitting diode. The term "main light-extracting surface" as used in this invention refers to the surface of the light-emitting part falling on the side opposite the surface to which the transparent substrate is joined.

In this invention, by forming the electrodes in this structure, it is made possible to obviate the necessity of passing the electric current to the transparent substrate to be fastened. Thus, the material having a high transmission factor can be selected from among various materials, such as insulators and high-resistance semiconductors, and the junction of the substrate having a high transmission factor enables impartation of high brightness.

This invention also prefers the transparent substrate to use, among side faces thereof a first side face nearly perpendicular to the light-emitting surface of the light-emitting layer at the portion on the side near the light-emitting layer and a second side face inclined relative to the light-emitting surface at the portion on the side distant from the light-emitting layer. The second side face continued into the first side face. The inclination is preferably directed to the inner side of the semiconductor layer. The reason that this invention adopts this structure consists in enabling the light emitted from the light-emitting layer toward the transparent substrate side to be efficiently extracted to the exterior. That is, part of the light released from the light-emitting layer toward the transparent substrate side is reflected on the first side face and extracted through the second side face. The light reflected on the second side face can be extracted through the first side face. The synergistic effect of the first side face and the second side face enables exaltation of the probability of the extraction of the light.

This invention prefers the second electrode to be formed at a position other than the position above the inclined structure of the second side face (in a projected view). The angle of inclination of the second side face is 10° or more and less than 20°. Preferably in a view projected on the light-emitting surface, part of the light-emitting part is formed above the second side face. In this invention, by forming the second electrode at this position, it is made possible to attain impartation of high brightness and enhance the efficiency of light extraction through the inclined surface.

In this invention, the second electrode is preferably composed of two or more straight lines of an equal length extending mutually in parallel and having extreme points thereof wherein an imaginary line connecting the extreme points on each side lies nearly in parallel to a side face of the chip, and one or more lines connecting the extreme points on the nearer sides of two adjacent parallel straight lines at an arbitrarily selected one of the opposite sides of the parallel straight lines (refer to FIG. 1, FIG. 6, FIG. 7 and FIG. 9). By adopting this shape, the second electrode is enabled to cover the whole of the light-emitting part and minimize the own area thereof. By increasing the number of parallel lines, it is made possible to cope with a still larger chip. The line connecting the terminal points of the parallel lines is most favorably such that the area of the electrode may be minimized. Since the second electrode needs to be provided thereon with a pad part necessary for the purpose of wire bonding, the line may be a curved line or a bent line in the sense that the freedom of positioning the pad part is increased. The increase in the freedom of positioning the pad part results in facilitating the manufacture of the chip.

For the sake of uniformly diffusing the electric current in the light-emitting part, it is necessary that the second electrode be evenly disposed relative to the light-emitting part. The electric current is not diffused throughout the whole of the light-emitting part when the distance between the electrode and the farthest part of the light-emitting part from the electrode is unduly large. When this distance is unduly small, the number (area) of electrodes is increased and consequently the light-extracting area is decreased and the brightness is lowered, though the diffusion of the electric current entails no problem. The distance that allows diffusion of the electric current from the electrode varies with the wavelength of the emitted light. In the light-emitting layer of AlGaInP (the wavelength of emitted light: 570 nm or more and 635 nm or less), the distance of diffusion of the electric current increases in accordance as the wavelength increases. The distance between the electrode and the farthest part of the light-emitting part from the electrode, therefore, has the optimum range relative to the wavelength of the emitted light. As regards the second electrode, this invention prefers to form a structure such that the distance between the end of the second electrode (the part of the electrode approximating most closely to the periphery of the device) and the end of the light-emitting part (the part of the light-emitting part approximating most closely to the periphery of the device) which is denoted by E (µm) and the main light-emitting wavelength which is denoted by $\lambda_D$ (nm) satisfy the relation, $0.8 \times \lambda_D - 350 < E < 1.6 \times \lambda_D - 750$ for the wavelength of the emitted light of $570 < \lambda_D < 635$.

Figure 18:
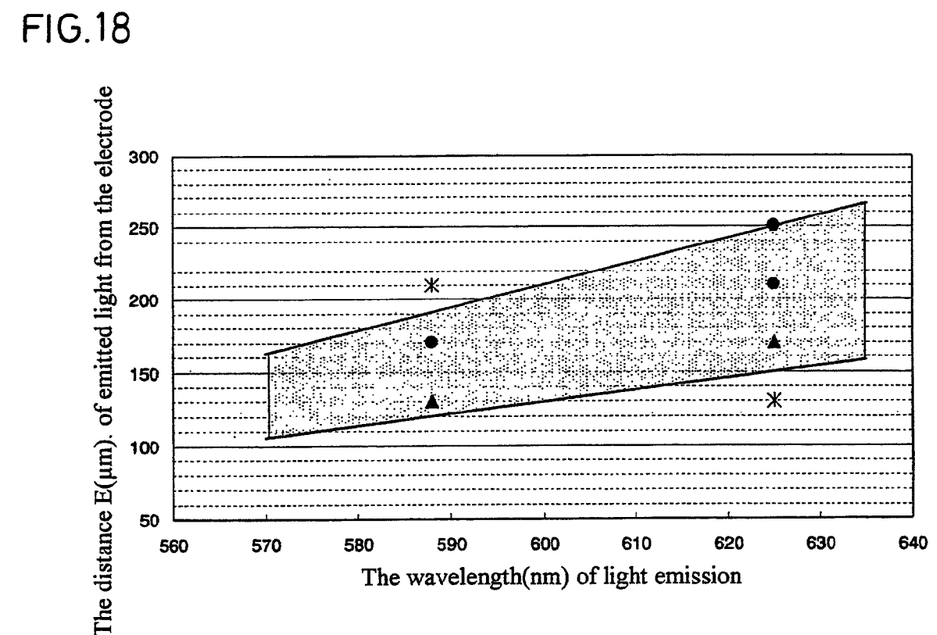
FIG. 18 is a diagram showing the relation between the wavelength (nm) of light emission and the distance E (μm) of emitted light from the electrode.

The relational expression mentioned above that is derived by plotting the region of diffusion of the electric current throughout the whole of the light-emitting part, with the wavelength of the emitted light assigned to the transverse axis and the distance between the end of the second electrode and the end of the light-emitting part assigned to the ordinate axis as shown in FIG. 18 allows the left term thereof to indicate the lower limit of the region and the right term thereof to indicate the upper limit of the region and represents the appearance of dilation of the scope of the aforementioned distance in accordance as the wavelength of the emitted light increases. By adopting the shape described above, it is made possible to attain diffusion of the electric current throughout the whole of the light-emitting part, suppress the addition to the area of the electrode as well, prevent the brightness from being lowered by the decrease of the light-extracting area, and accomplish impartation of high brightness. Further, the aforementioned condition that the second electrode should be disposed at a position other than the upper side of the inclined side face is fulfilled.

Figure 19:
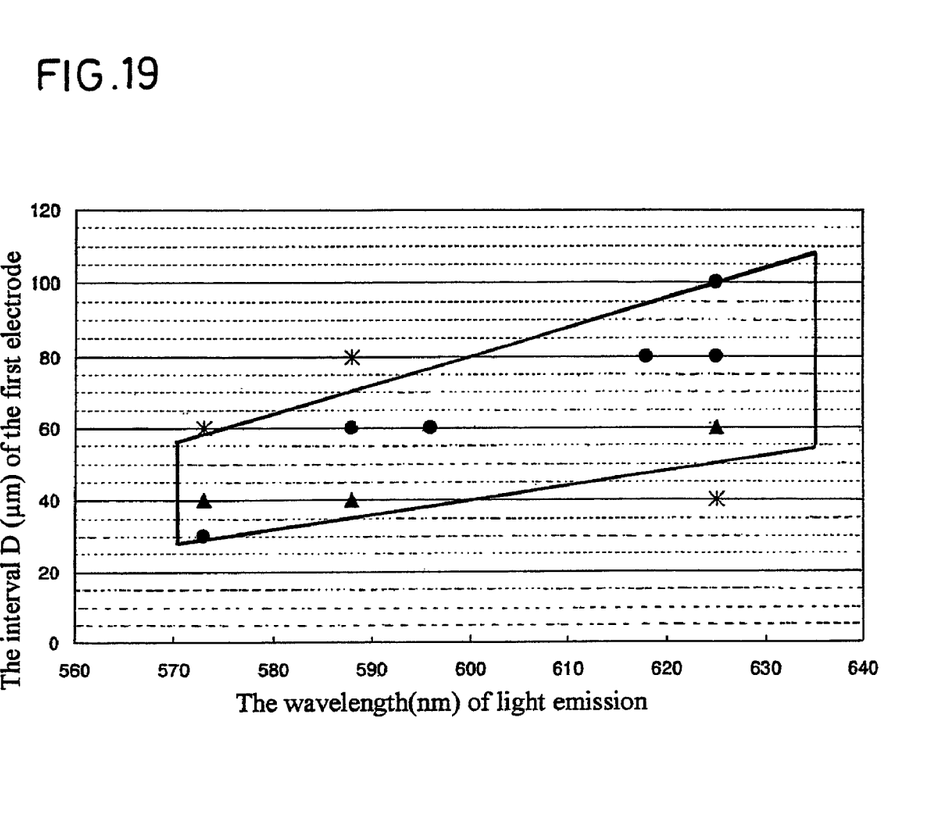
FIG. 19 is a diagram showing the relation between the interval D (μm) of the first electrode and the wavelength (nm) of light emission.

The first electrode likewise has the optimum range of the current diffusion distance relative to the wavelength of the emitted light. This invention prefers to form a structure such that the relations, $570 < \lambda_D < 635$ and $0.4 \times \lambda_D - 200 < D < 0.8 \times \lambda_D - 400$, are satisfied as shown in FIG. 19 on the condition that the first electrode is formed by combining lines having a width of 15 µm or less and that the distance between the adjacent lines is denoted by D (µm) and the main light-emitting wavelength is denoted by $\lambda_D$ (nm). The foregoing relational expression expresses the region allowing uniform diffusion of the electric current in the light-emitting part. The part allowing no diffusion of the electric current occurs when the interval of the first electrode is unduly wide. It is required that the area of the electrode be increased when the interval is unduly narrow. By adopting this structure, it is made possible to attain diffusion of the electric current throughout the whole of the light-emitting part, suppress addition to the area of the electrode, prevent the brightness from being lowered in consequence of the decrease of the light-extracting area, and accomplish impartation of high brightness.

This invention prefers the angle between the second side face and the first side face to fall in the range of 10° to 20°. By adopting this range, it is made possible to attain efficient extraction of the light reflected on the bottom part of the transparent substrate to the exterior.

Then, this invention prefers the width (the direction of thickness) of the first side face to fall in the range of 30 µm to 100 µm. By having the width of the first side face fall in this range, the light reflected on the bottom part of the transparent substrate can be efficiently returned at the portion of the first side face to the light-emitting surface and further be released through the main light-extracting surface, with the result that the efficiency of light emission by the light-emitting diode will be attained successfully.

This invention preferably forms the light-emitting part in a structure containing a GaP layer and allows the second electrode to be formed on the GaP layer. The adoption of this structure results in acquiring an effect of lowering the operating voltage. By forming the second electrode on the GaP layer, it is made possible to attain good ohmic contact and lower the operating voltage.

This invention preferably forms the first electrode in an n-type polarity and the second electrode in a p-type polarity. The adoption of this structure results in inducing an effect of imparting high brightness. The formation of the first electrode in the p-type results in deteriorating the diffusion of electric current owing to high electric resistance and inducing degradation of the brightness. The formation of the first electrode in the n-type results in enhancing the diffusion of electric current and attaining impartation of high brightness.

This invention prefers to coarsen the inclined surface of the transparent substrate. The adoption of this structure results in attaining an effect of enhancing the efficiency of light extraction through the inclined surface. By coarsening the inclined surface, it is made possible to suppress total reflection on the inclined surface and enhance the efficiency of light extraction. The surface can be coarsened by the chemical etching with a mixture consisting of phosphoric acid, hydrogen peroxide and water+hydrochloric acid.

Then, this invention prefers to form irregularities having a difference of elevation in the range of 0.1 μm to 10 μm on the bottom surface of the transparent substrate. The adoption of this structure induces an effect of enabling the light entrapped in the chip to be reflected diffusely and efficiently extracted to the exterior of the chip.

This invention prefers to form the second side face by the dicing method. The adoption of this method of production results in inducing an effect of enhancing the yield of production. Though the formation of the second side face can be attained by the combination of methods, such as wet etching, dry etching, scribe method and laser processing method, the dicing method proves to be most suitable because it has an ability to control a shape and excels in productivity.

This invention prefers to form the first side face by the dicing method. The adoption of this method of production enables the cost of production to be lowered. To be specific, since this method of production does not need to allow a cutting margin during the separation of chips, a large number of light-emitting diodes can be produced and the cost of production can be lowered consequently. The adoption of this method of production results in enhancing the efficiency of light extraction through the first side face and accomplishing impartation of high brightness.

This invention prefers to form the light-emitting diode in a structure such that the area of the light-emitting layer, the area of the first electrode and the surface of the second electrode that are denoted respectively by $S_A$, $S_1$ and $S_2$ satisfy the relations 80%<$S_A$<90%, 10%<$S_1$<20% and 5%<$S_{2<10}$% on the condition that the external shape of the light-emitting surface of the light-emitting diode has an area of 100%. The adoption of this shape enables impartation of high brightness because a small electrode area suffices efficient emission of light from a large area of light emission.

This invention prefers to have the transparent electrically conductive film so formed as to cover the first electrode and part of the light-extracting surface. The adoption of this shape results in enabling the transparent electrically conductive film to facilitate diffusion of the electric current and permitting production of an LED chip of low operating voltage. This invention further prefers to form the transparent electrically conductive film of ITO. The ITO manifests low resistance and possesses a high transmission factor and induces an effect of lowering the operating voltage without interfering with the extraction of light.

Example 1

Example 1 offers concrete explanation of an example of fabricating a light-emitting diode contemplated by this invention.

Figure 1:
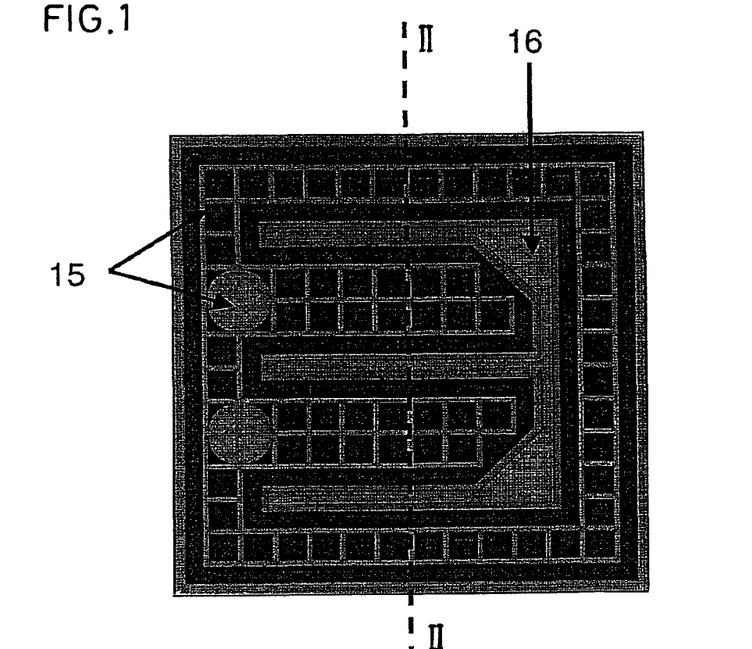
FIG. 1 is a plan view of a semiconductor light-emitting diode according to Example 1 of this invention pertain.
Figure 2:
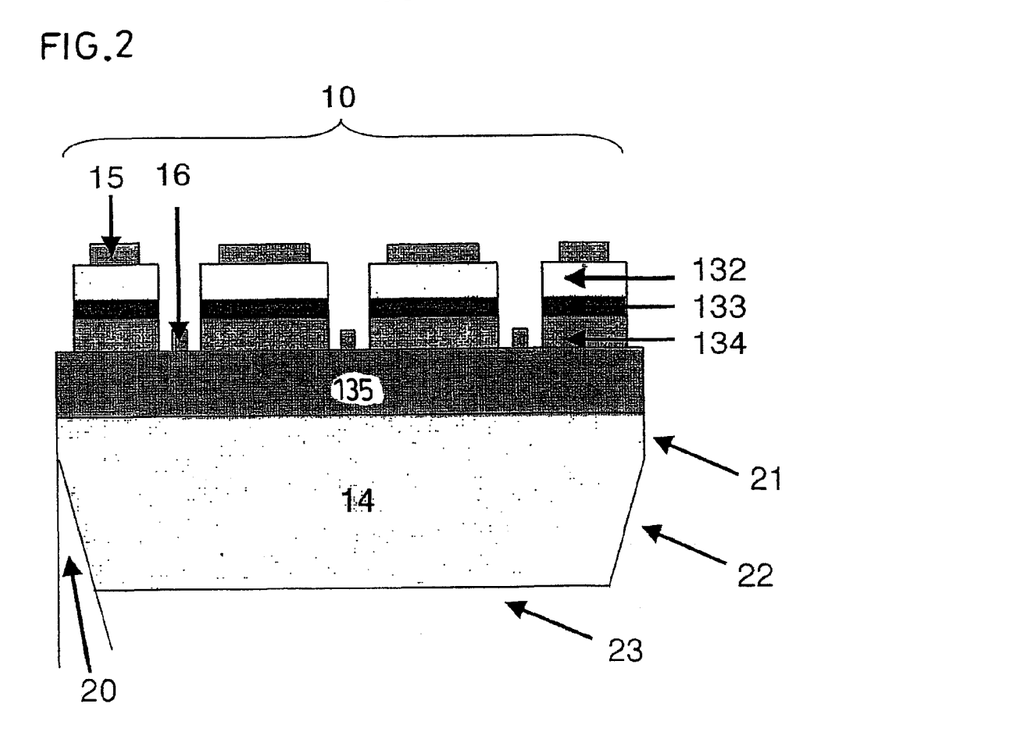
FIG. 2 is a cross section of the semiconductor light-emitting diode, taken across FIG. 1 along line II-II.
Figure 3:
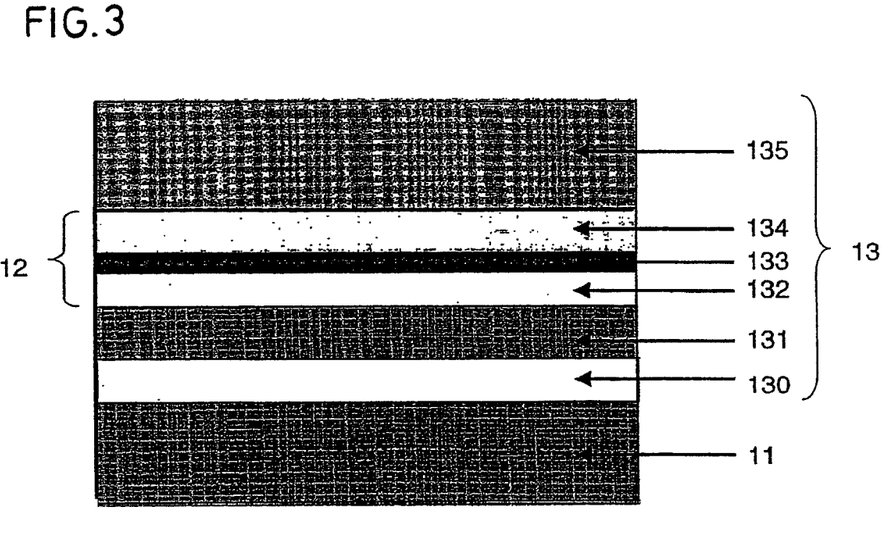
FIG. 3 is a cross section of an epitaxial wafer according to Example 1 of this invention and Comparative Examples 1.

FIG. 1 and FIG. 2 are diagrams illustrating the semiconductor light-emitting diode fabricated in Example 1; FIG. 1 being a plan view and FIG. 2 a cross section taken across FIG. 1 along line II-II. FIG. 3 is a cross section of the layered structure of a semiconductor epitaxial wafer to be used for the semiconductor light-emitting diode.

A semiconductor light-emitting diode 10 fabricated in Example 1 was a red Light-Emitting Diode (LED) provided with an AlGaInP light-emitting part.

Example 1 explains this invention specifically by citing as an example the case of fabricating the light-emitting diode by joining a GaP substrate to an epitaxial stacked structure (epitaxial wafer) disposed on a GaAs substrate.

The LED 10 was fabricated using an epitaxial wafer provided with semiconductor layers 13 sequentially stacked on a semiconductor substrate 11 formed of an Si-doped n-type GaAs single crystal possessing a surface inclined by 15° from a (100) face. The stacked semiconductor layers are an Si-doped n-type buffer layer 130 formed of GaAs, an Si-doped n-type contact layer 131 formed of $(Al_{0.5}Ga_{0.5})_{0.5}In_{0.5}P$, an Si-doped n-type lower clad layer 132 formed of $(Al_{0.7}Ga_{0.3})_{0.5}In_{0.5}P$, an undoped light-emitting layer 133 formed of 20 pairs of $(Al_{0.2}Ga_{0.8})_{0.5}In_{0.5}P$ and $(Al_{0.7}Ga_{0.3})_{0.5}In_{0.5}P$, an Mg-doped p-type upper clad layer 134 formed of $(Al_{0.7}Ga_{0.3})_{0.5}In_{0.5}P$ and an Mg-doped p-type GaP layer 135.

In Example 1, the component semiconductor layers 130 to 135 were stacked on the GaAs substrate 11 by the low-pressure MetalOrganic Chemical Vapor Deposition method (MOCVD method) using trimethyl aluminum (($CH_3$)$_3$Al), trimethyl gallium (($CH_3$)$_3$Ga) and trimethyl indium (($CH_3$)$_3$In) as the raw materials for Group m component elements, with the result that an epitaxial wafer was formed. Bis-cyclopentadiethyl magnesium (bis-($C_5H_5$)$_2$Mg) was used as the raw material for Mg doping. Disilane ($Si_2H_6$) was used as the raw material for Si doping. Then, phosphine ($PH_3$) or arsine ($AsH_3$) was used as the raw material for a Group V component element. The GaP layer 135 was grown at 750° C. and the other component semiconductor layers 130 to 134 forming the semiconductor layer 13 were grown at 730° C.

The GaAs buffer layer 130 had a carrier concentration of $2\times10^{18}$ cm$^{-3}$ and a layer thickness of 0.2 μm. The contact layer was formed of $(Al_{0.5}Ga_{0.5})_{0.5}In_{0.5}P$ and had a carrier concentration of $2\times10^{18}$ cm$^{-3}$ and a layer thickness of 1.5 μm. The n-clad layer 132 had a carrier concentration of $8\times10^{17}$ cm$^{-3}$ and a layer thickness of 1 μm. The light-emitting layer 133 was an undoped layer having a layer thickness of 0.8 μm. The p-clad layer 134 had a carrier concentration of $2\times10^{17}$ cm$^{-3}$ and a layer thickness of 1 μm. The GaP layer 135 had a carrier concentration of $3\times10^{18}$ cm$^{-3}$ and a layer thickness of 9 μm.

The region of the p-type GaP layer 135 reaching a depth of 1 μm from the first surface was polished till specular finish. By the specular finish, the surface of the p-type GaP layer 135 was given roughness of 0.18 nm. Meantime, an n-type GaP substrate 14 to be applied to the surface of specular finish of the p-type GaP layer 135 was prepared. To the GaP substrate 14 ready for application, Si was added till a carrier concentration of $2\times10^{17}$ cm$^{-3}$. A single crystal having a surface orientation of (111) was used. The GaP substrate 14 awaiting application had a diameter of 50 mm and a thickness of 250 μm. This GaP substrate 14, prior to being joined to the p-type GaP layer 135, has the surface thereof polished specularly to a root-square-mean value of 0.12 nm.

The GaP substrate 14 and epitaxial wafer were brought into a processing device and the interior of the device was evacuated till a vacuum. Thereafter, the surfaces of the GaP substrate 14 and the epitaxial wafer were irradiated with an accelerated Ar beam for the purpose of depriving the surfaces of contamination. Thereafter, these two components were joined at room temperature.

Next, the GaAs substrate 11 and the GaAs buffer layer 130 were selectively removed with an ammonia-based etchant from the joined wafer.

On the first surface of the contact layer 131, AuGe (mass ratio of Ge: 12%) was deposited in a thickness of 0.15 μm, Ni in a thickness of 0.05 μm and Au in a thickness of 1 μm by the vacuum evaporation method to form an n-type ohmic electrode 15. This electrode was patterned by way of finishing in accordance with the ordinary means of photolithography. The n-type ohmic electrode was formed in the shape of a lattice measuring 10 μm in width and 60 μm in interval (FIG. 1).

Next, the GaP layer 135 was exposed by selectively removing the parts of the epitaxial layers 131 to 134 in the region forming the p-electrode. On the surface of the GaP layer, AuBe was deposited in a thickness of 0.2 μm and Au in a thickness of 1 μm by the vacuum evaporation method to form a p-type ohmic electrode 16. The p-type ohmic electrode 16 was formed in the shape of two stacked layers each consisting of three sides of a square having a width of 25 μm (FIG. 1). At this time, the distance from the end of the light-emitting part to the end of the p-type ohmic electrode was 130 μm. Thereafter, the resultant joined layers were heat-treated for the sake of alloying at 450° C. for 10 minutes, with the result that p-type and n-type ohmic electrodes with low resistance were formed.

Thereafter, by the use of the vacuum evaporation method, Au was deposited till a thickness of 1 μm on part of the n-type ohmic electrode to form a bonding pad. Further, the semiconductor layer was coated with an $SiO_2$ film deposited till a thickness of 0.3 μm and used as a protective film.

Next, a V-shaped groove was inserted into the GaP substrate 14 from the back surface thereof by the use of a dicing saw in such a manner as to give an inclined surface an angle (denoted by reference numeral 20 in FIG. 2) of 15° and give a second side face 22 a length of 180 μm. Thereafter, the first surface of the light-emitting diode was protected with a resist and a back surface 23 of the GaP substrate 14 was coarsened by being etched with a mixed solution of phosphoric acid, hydrogen peroxide and water+hydrochloric acid. The back surface of the GaP substrate 14 had a root-mean-square value (rms) of 500 nm.

Next, the wafer was cut from the first surface side at intervals of 1 mm with a dicing saw into chips. The first side face 21 had a length of 80 μm and lay substantially perpendicular to the light-emitting layer.

The broken layer was removed by dicing and the contamination was removed by etching with a mixed liquid of sulfuric acid and hydrogen peroxide, with the result that the semiconductor light-emitting diode (chip) 10 was fabricated.

Figure 4:
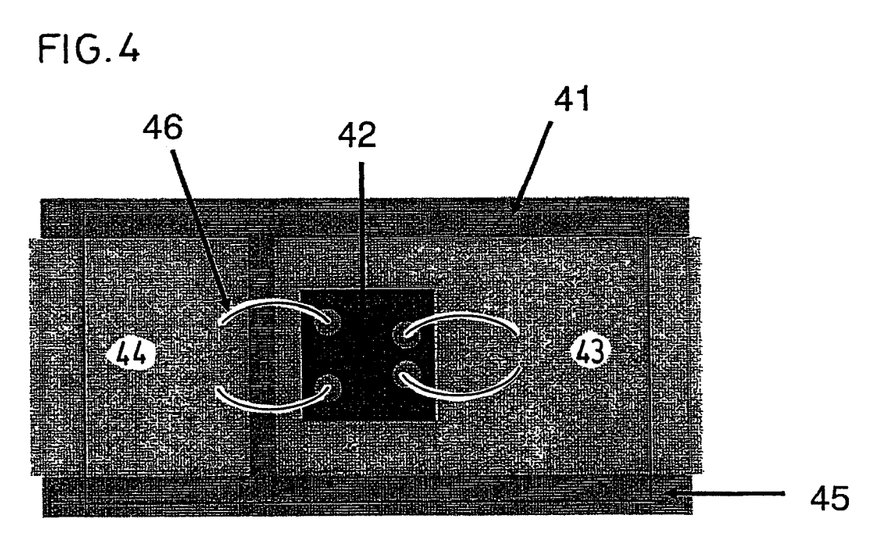
FIG. 4 is a plan view of a semiconductor light-emitting lamp to which Example 1 of this invention and Comparative Example 1 pertain.
Figure 5:
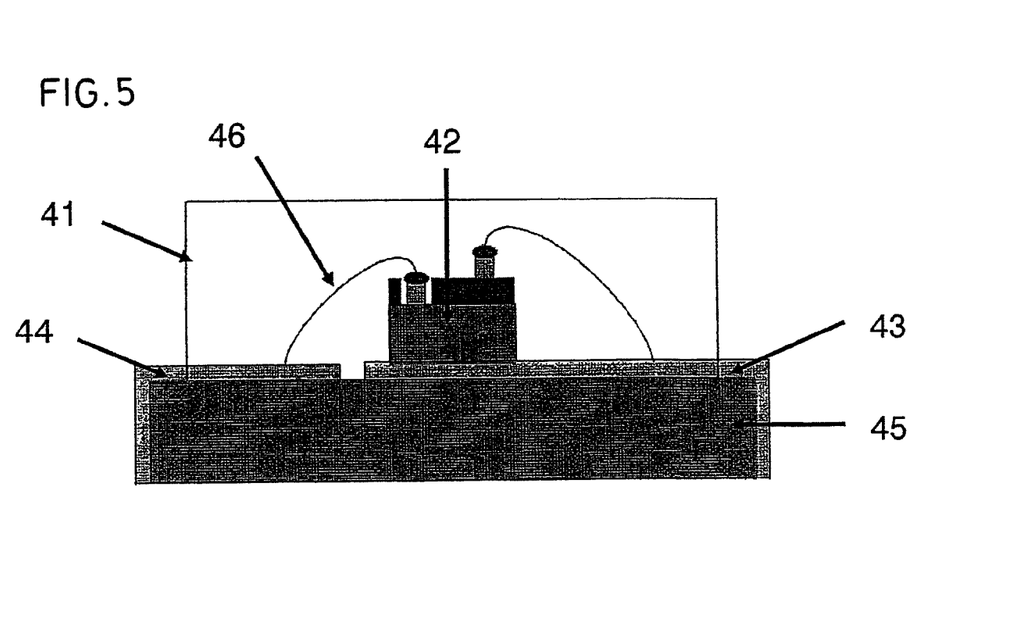
FIG. 5 is a cross section of the semiconductor light-emitting diode lamp of FIG. 4.

With the LED chips 10 fabricated as described above, a light-emitting diode lamp 42 was assembled as schematically illustrated in FIG. 4 and FIG. 5. This LED lamp 42 was manufactured by mounting the LED chip fast on a mounting substrate 45 with silver (Ag) paste, wire-bonding the n-type ohmic electrode 15 of the LED chip 10 with an n-electrode terminal 43 installed on the first surface of the mounting substrate 45 and the p-type ohmic electrode 16 with a p-electrode terminal 44 with a gold wire 46, and thereafter sealing the joined corners with an ordinary epoxy resin 41.

When an electric current was passed between the n-type and p-type ohmic electrodes 15 and 16 via the n-electrode terminal 43 and the p-electrode terminal 44 disposed on the first surface of the mounting substrate 45, a red-color light having a main wavelength of 620 nm was emitted. The forward voltage (Vf) during the passage of an electric current of 400 mA in the forward direction reached 2.3 V, a magnitude reflecting the good ohmic properties of the ohmic electrodes 15 and 16. The intensity of the light emitted when the forward current was set at 400 mA reached a high degree of brightness of 4000 mcd, a magnitude reflecting the structure of the light-emitting part of a high efficiency of light emission and the fact that the efficiency of extraction to the exterior was enhanced as by removing the broken layer during the separation of the wafer into chips.

Comparative Example 1

While Example 1 had chip side faces comprise a first side face nearly perpendicular to the light-emitting surface of the light-emitting layer and a second side face inclined relative to the light-emitting surface, Comparative Example 1 changed side faces in shape and had chip side faces comprise only a first side face nearly perpendicular to the light-emitting surface. Comparative Example 1 had the same process as Example 1 up to the formation of the p-type and n-type ohmic electrodes and cut the wafer at intervals of 1 mm from the first surface side with a dicing saw to produce chips without inserting V-shaped grooves into the GaP substrate from the back surface side with a dicing saw and coarsening the faces by etching. The chip side face was so formed as to lie nearly perpendicularly to the light-emitting layer. Next, the chip was completed by removing the broken layer and the contamination formed in consequence of the dicing by etching with a mixed liquid of sulfuric acid and hydrogen peroxide. When the chip was evaluated in the same manner as in Example 1, it was found that the efficiency of light extraction through the chip side face was inferior and the intensity of light emission was only 2500 mcd.

Example 2

Figure 6:
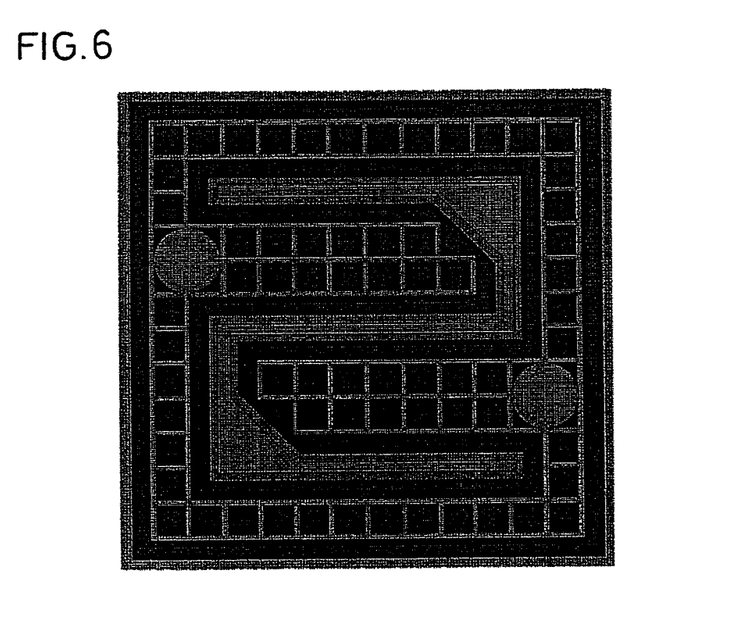
FIG. 6 is a plan view of a semiconductor light-emitting diode according to Example 2 of this invention pertain.
Figure 7:
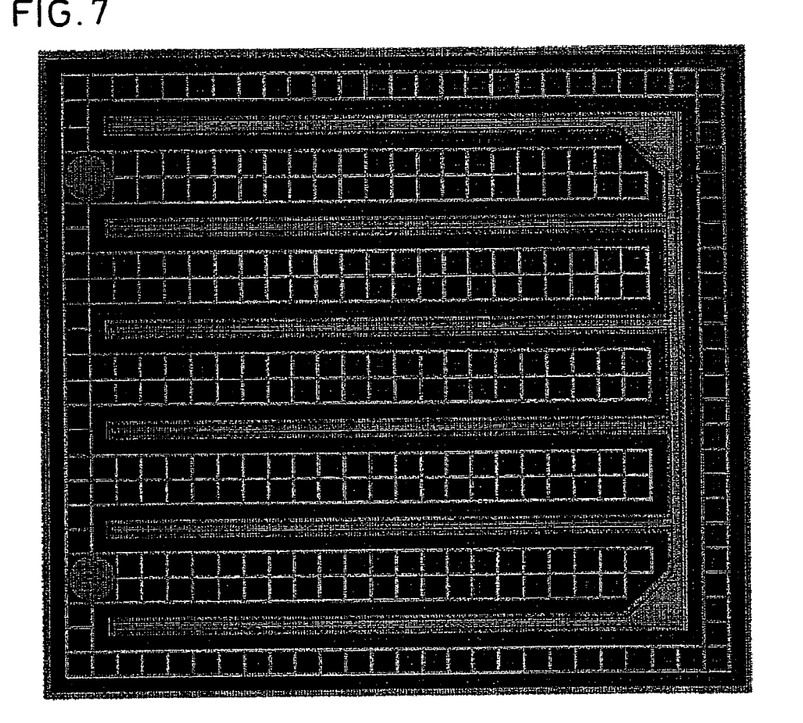
FIG. 7 is a plan view of another semiconductor light-emitting according to Example 2 of this invention pertain.

A light-emitting diode was fabricated by following the procedure of Example 1 while changing the shape of a p-type ohmic electrode. The relevant shape was as shown in FIG. 6. The light-emitting diode thus obtained had the same advantages of low resistance and high brightness as the product of Example 1 notwithstanding that one side of the letter of three sides of a square of the p-type ohmic electrode was reversed bilaterally as shown in the FIG. 6. Besides this alteration, the p-type ohmic electrode is allowed to possess numerous varied shapes and patterns. A further addition to the size of the LED chip can be coped with by increasing the number of the letters of three sides of a square (FIG. 7).

Comparative Example 2

Figure 8:
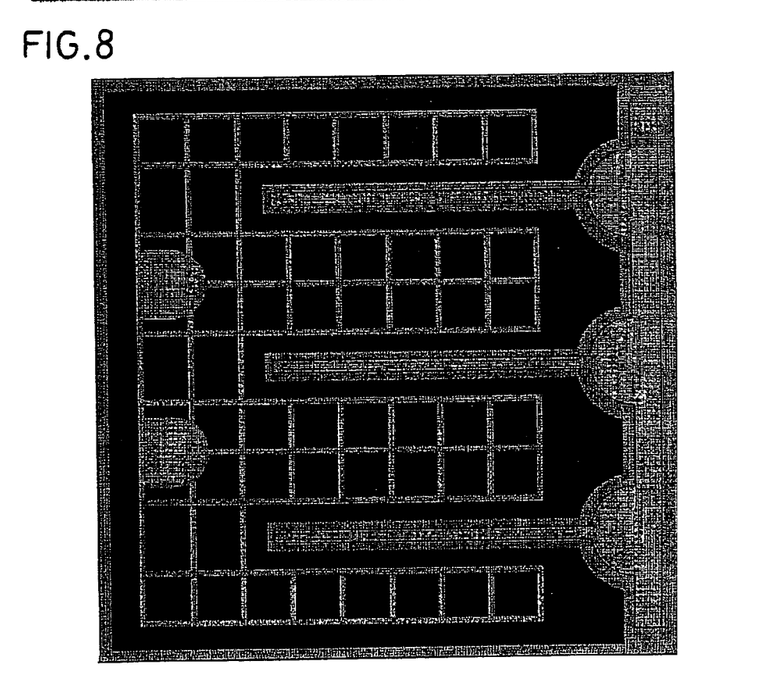
FIG. 8 is a plan view of a semiconductor light-emitting diode according to Comparative Example 2.
Figure 9:
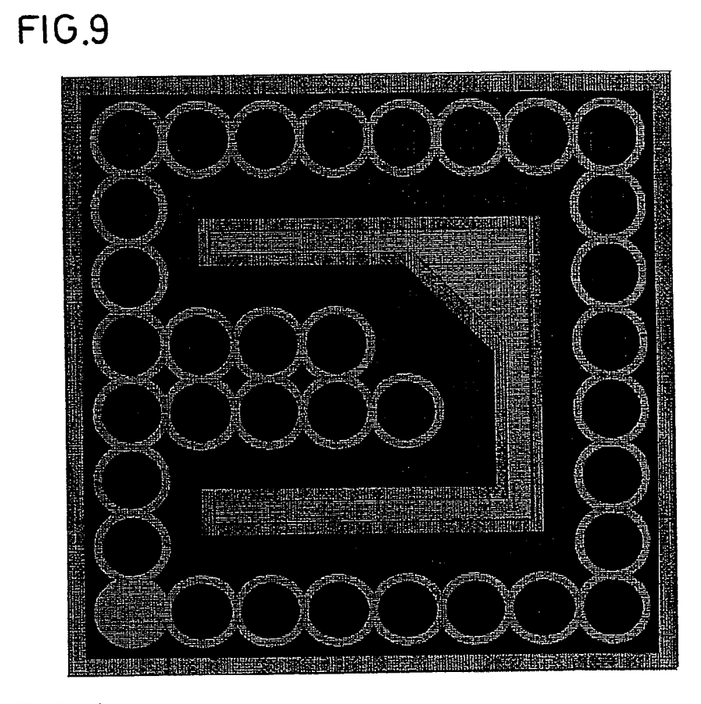
FIG. 9 is a plan view of a semiconductor light-emitting diode according to Example 3 of this invention.
Figure 10:
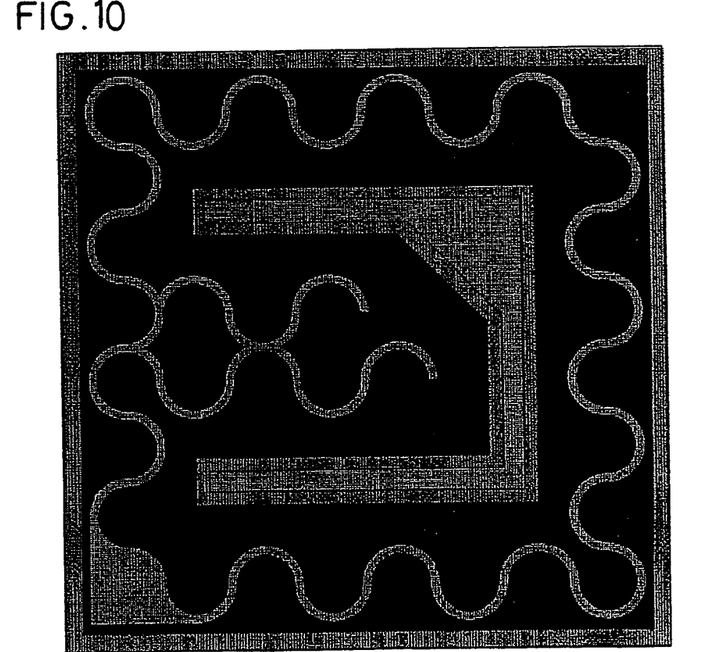
FIG. 10 is a plan view of another semiconductor light-emitting diode according to Example 3 of this invention.
Figure 11:
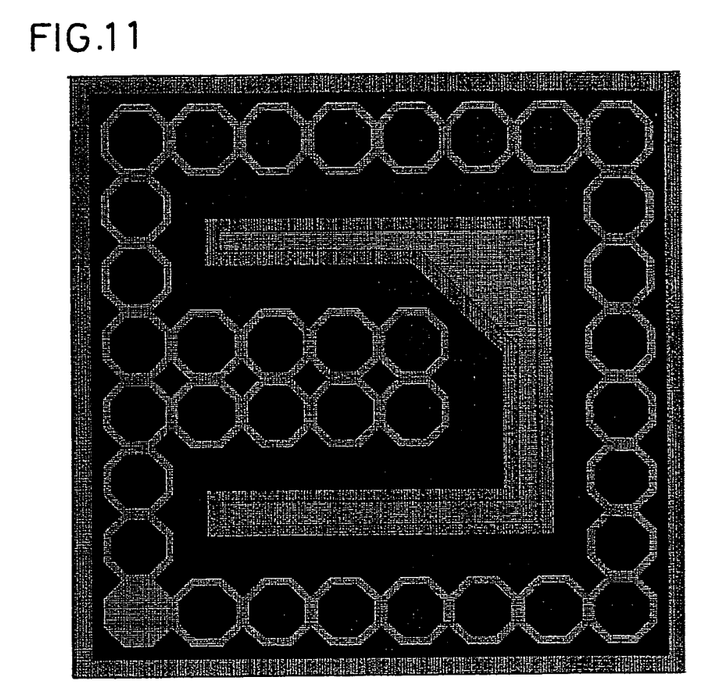
FIG. 11 is a plan view of still another semiconductor light-emitting diode according to Example 3 of this invention.
Figure 12:
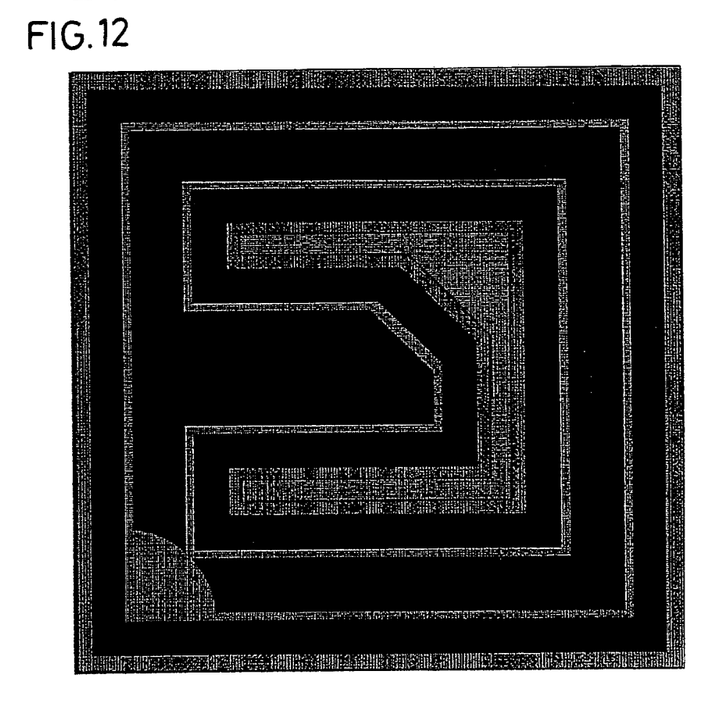
FIG. 12 is a plan view of yet another semiconductor light-emitting diode according to Example 3 of this invention.
Figure 13:
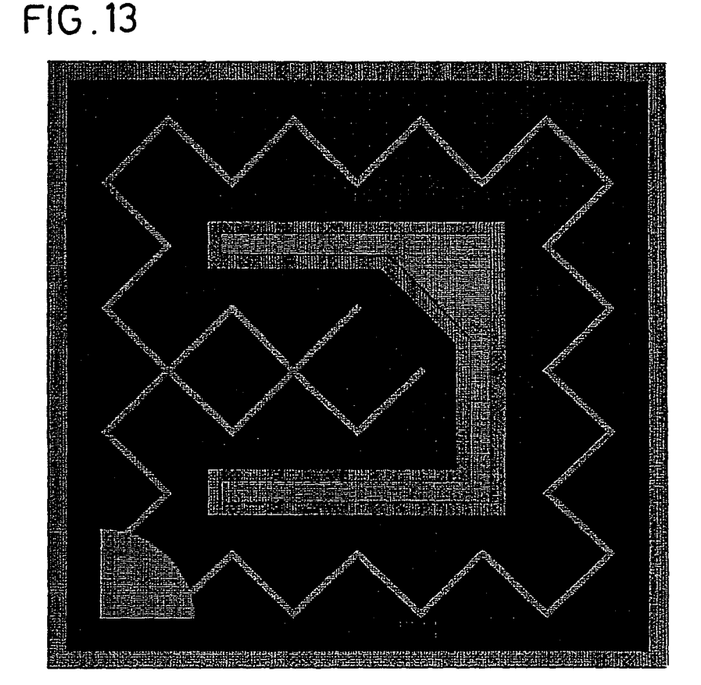
FIG. 13 is a plan view of a further semiconductor light-emitting diode according to Example 3 of this invention.
Figure 14:
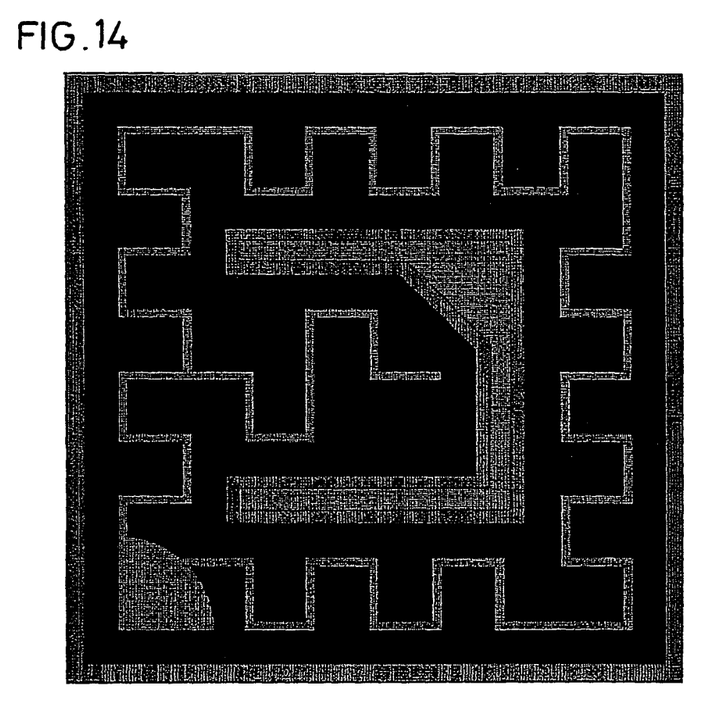
FIG. 14 is a plan view of a further semiconductor light-emitting diode according to Example 3 of this invention pertains.
Figure 15:
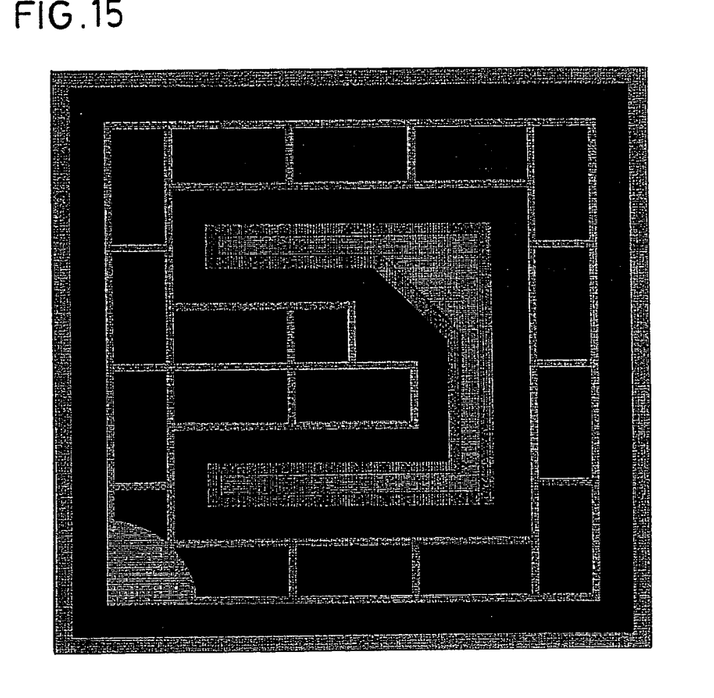
FIG. 15 is a plan view of a further semiconductor light-emitting diode according to Example 3 of this invention pertains.

When the procedure of Example 1 was followed except a p-type ohmic electrode was disposed in the neighborhood of the end of the light-emitting part (FIG. 8), the efficiency of light extraction was lowered because the light-emitting part was not present above the inclined surface of the GaP substrate. When the product was evaluated in the same manner as in Example 1, the intensity of light emission was only 3500 mcd. By having the p-type ohmic electrode disposed in the neighborhood of the center, it was made possible to heighten the efficiency of light extraction.

Example 3

Light-emitting diodes were fabricated by following the procedure of Example 1 while a p-type ohmic electrode and an n-type ohmic electrode were formed in the shapes illustrated in FIG. 9 to FIG. 15. These products possessed the same advantages of low resistance and high brightness as the product of Example 1.

Example 4

Figure 16:
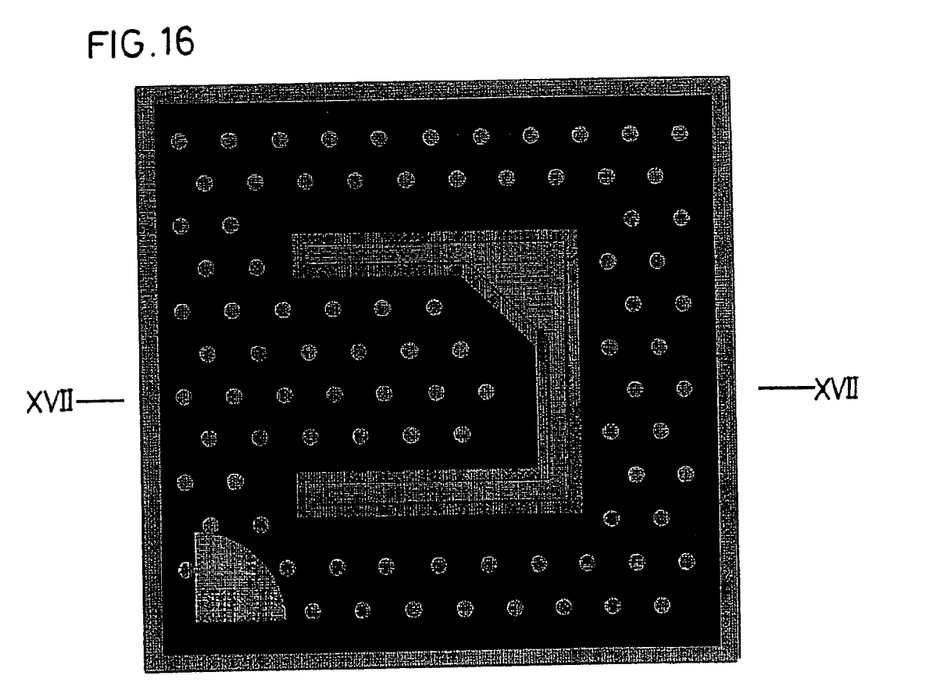
FIG. 16 is a plan view of a semiconductor light-emitting diode according to Example 4 of this invention pertains.
Figure 17:
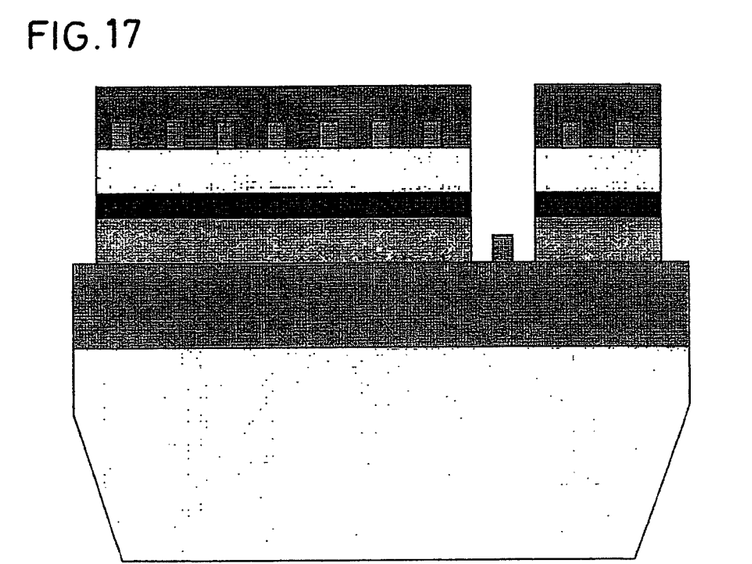
FIG. 17 is a cross section of the semiconductor light-emitting diode, taken across FIG. 16 along line XVII-XVII.

In Example 4, a light-emitting diode chip having a transparent electrically conductive film installed therein was fabricated by using the same substrate and epitaxial wafer as in Example 1. FIG. 16 and FIG. 17 are diagrams illustrating the semiconductor light-emitting diode that was fabricated in Example 4, FIG. 16 being a plan view thereof and FIG. 17 a cross section taken across FIG. 16 along line XVII-XVII. On the surface of a contact layer, AuGe (mass ratio of Ge: 12%) was deposited to a thickness of 0.15 μm and Ni to a thickness of 0.05 μm by the vacuum evaporation method to attain deposition of an n-type ohmic electrode. Patterning the resultant stacked layers by the use of the ordinary means of photolithography resulted in forming a circular electrode having a diameter of 30 μm. The center distance between the most adjacent n-type ohmic electrodes was set at 0.25 mm. Thereafter, a p-type ohmic electrode was formed and alloyed by a heat treatment performed at 450° C. for 10 minutes.

Next, a transparent electrically conductive film formed of Indium Tin Oxide (ITO) and covering the light-emitting surface of the upper clad layer and the n-type ohmic electrode was deposited to a thickness of 300 nm by an ordinary magnetron sputtering method. The transparent electrically conductive film had specific resistance of $2 \times 10^{-4}$ Ω·cm and showed a transmission factor of 94% to the light of the wavelength of light emission.

Next, a bonding pad was formed on part of the transparent electrically conductive film by depositing Au to a thickness of 1 μm by the vacuum evaporation method. Further, the semiconductor layer was coated with an $SiO_2$ film deposited to a thickness of 0.3 μm and used as a protective film. Thereafter, a light-emitting diode chip was obtained by following the procedure of Example 1.

When this light-emitting diode chip was evaluated in the same manner as in Example 1, it was found to possess the same advantages of low resistance and high brightness as the product of Example 1 because the transparent electrically conductive film exhibited an effect of uniformly diffusing an electric current and an effect of extracting the light of the wavelength of light emission with virtually no loss.

INDUSTRIAL APPLICABILITY

This invention, owing to the optimization of the disposition of electrodes and the shape of chips, enables provision of a light-emitting diode having a large size, manifesting high brightness not attainable hitherto and low operating voltage, ensuring high reliability and permitting utility in various kinds of display lamps.

The invention claimed is:
1. A light-emitting diode having a main light-extracting surface and comprising:
    a compound semiconductor layer including semiconductor layers;
    a light-emitting part contained in the compound semiconductor layer;
    a light-emitting layer contained in the light-emitting part;
    a transparent substrate joined to the compound semiconductor layer; and
    first and second electrodes of opposite polarities formed on the main light-extracting surface on a side opposite the transparent substrate;
    wherein the second electrode is formed at a position on a portion of the compound semiconductor layer exposed by removal of the light-emitting layer and has a periphery which is entirely enclosed with the light-emitting part whose light-emitting layer is not removed; and
    wherein the main light-extracting surface has an external shape having a largest width of 0.8 mm or more;
    wherein the transparent substrate contains a first side face nearly perpendicular and falling on a side of the light-emitting part and a second side face continuing to the first side face and having an inclined surface formed on a side distant from the light-emitting layer; and
    wherein the inclined surface of the second side face has an angle of inclination that is 10° or more and less than 20° and wherein the light-emitting part, when seen as projected on a light-emitting surface, has part thereof formed above the second side face.
2. A light-emitting diode according to claim 1, wherein the transparent substrate is a substrate that is pervious to light emitted from the light-emitting part.
3. A light-emitting diode according to claim 1, wherein the transparent substrate has a bottom surface formed thereon with irregularities having differences of elevation in a range of 0.1 μm to 10 μm.
4. A light-emitting diode according to claim 1, wherein the transparent substrate is formed of GaP.
5. A light-emitting diode according to claim 4, wherein the transparent substrate is formed of n-type GaP and has a roughly (111) face as its main surface.
6. A light-emitting diode according to claim 1, wherein the transparent substrate has a thickness in a range of 50 to 300 μm.
7. A light-emitting diode according to claim 1, wherein the light-emitting layer, first electrode and second electrode have areas $S_A$, $S_1$ and $S_2$, respectively, that satisfy relations 80%<$S_A$<90%, 10%<$S_1$<20% and 5%<$S_2$<10%, on condition that the light-emitting diode has a light-emitting surface of an external shape having an area of 100%.
8. A light-emitting diode according to claim 1, wherein the second electrode is composed of two or more straight lines of an equal length extending mutually in parallel and having extreme points on opposite sides thereof wherein an imaginary line connecting the extreme points on each side lies nearly in parallel to a side face of the light-emitting diode, and one or more lines connecting the extreme points on nearer sides of two adjacent parallel straight lines at an arbitrarily selected one of the opposite portions of the parallel straight lines.
9. A light-emitting diode having a main light-extracting surface and comprising:
    a compound semiconductor layer including semiconductor layers;
    a light-emitting part contained in the compound semiconductor layer;
    a light-emitting layer contained in the light-emitting part;
    a transparent substrate joined to the compound semiconductor layer; and first and second electrodes of opposite polarities formed on the main light-extracting surface on a side opposite the transparent substrate;

wherein the second electrode is formed at a position on a portion of the compound semiconductor layer exposed by removal of the light-emitting layer and has a periphery which is entirely enclosed with the light-emitting part whose light-emitting layer is not removed; and wherein the main light-extracting surface has an external shape having a largest width of 0.8 mm or more;

wherein the transparent substrate contains a first side face nearly perpendicular and falling on a side of the light-emitting part and a second side face continuing to the first side face and having an inclined surface formed on a side distant from the light-emitting layer; and wherein the second electrode falls outside a range of the inclined surface of the second face when it is projected on a light-emitting surface.

10. A light-emitting diode having a main light-extracting surface and comprising:

a compound semiconductor layer including semiconductor layers;

a light-emitting part contained in the compound semiconductor layer;

a light-emitting layer contained in the light-emitting part;

a transparent substrate joined to the compound semiconductor layer; and first and second electrodes of opposite polarities formed on the main light-extracting surface on a side opposite the transparent substrate;

wherein the second electrode is formed at a position on a portion of the compound semiconductor layer exposed by removal of the light-emitting layer and has a periphery which is entirely enclosed with the light-emitting part whose light-emitting layer is not removed; and wherein the main light-extracting surface has an external shape having a largest width of 0.8 mm or more; and wherein a distance E μm between an end of the second electrode and an end of the light-emitting part and a main light-emitting wavelength $\lambda_D$ nm satisfy relations of $570<\lambda_D<635$ and $0.8\times\lambda_D-350<E<1.6\times\lambda_D-750$.

11. A light-emitting diode having a main light-extracting surface and comprising:

a compound semiconductor layer including semiconductor layers;

a light-emitting part contained in the compound semiconductor layer;

a light-emitting layer contained in the light-emitting part;

a transparent substrate joined to the compound semiconductor layer; and first and second electrodes of opposite polarities formed on the main light-extracting surface on a side opposite the transparent substrate;

wherein the second electrode is formed at a position on a portion of the compound semiconductor layer exposed by removal of the light-emitting layer and has a periphery which is entirely enclosed with the light-emitting part whose light-emitting layer is not removed; and wherein the main light-extracting surface has an external shape having a largest width of 0.8 mm or more; and wherein when the first electrode is formed by combining lines having a width of 15 or less, a distance D μm between the adjacent lines and a main light-emitting wavelength $\lambda_D$ nm satisfy relations of $570<\lambda_D<635$ and $0.4\times\lambda_D-200<D<0.8\times\lambda_D-400$.

12. A light-emitting diode according to claim 1, further comprising a transparent electrically conductive film formed so as to cover the first electrode and at least part of the light-extracting surface.

13. A light-emitting diode according to claim 12, wherein the transparent electrically conductive film is formed of ITO.

14. A light-emitting diode according to claim 1, wherein the light-emitting part contains a GaP layer and the second electrode is formed on the GaP layer.

15. A light-emitting diode according to claim 1, wherein the first electrode is in an n-type polarity and the second electrode is in a p-type polarity.

16. A light-emitting diode according to claim 1, wherein the compound semiconductor layer containing the light-emitting part is formed of a composition of $(Al_XGa_{1-X})_YIn_{1-Y}P$ ($0\leq X\leq 1$, $0<Y\leq 1$).

17. A light-emitting diode according to claim 1, wherein the light-emitting part contains AlGaInP.

18. A light-emitting diode according to claim 1, wherein the first side face and the second side face are formed by the dicing method.

19. A light-emitting diode according to claim 12, wherein the transparent electrically conductive film is not formed over the second electrode.

* * * * *